(12) United States Patent
Tada et al.

(10) Patent No.: US 7,626,156 B2
(45) Date of Patent: Dec. 1, 2009

(54) IMAGE SENSOR HAVING PLURAL PIXELS ADJACENT TO EACH OTHER IN A THICKNESS DIRECTION AND METHOD FOR MANUFACTURING THE SAME

(75) Inventors: Hiroshi Tada, Kanagawa (JP);
Masayuki Hayashi, Kanagawa (JP);
Masaya Nakayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/209,000

(22) Filed: Sep. 11, 2008

(65) Prior Publication Data
US 2009/0072122 A1    Mar. 19, 2009

(30) Foreign Application Priority Data
Sep. 13, 2007   (JP)   ............................. 2007-238257

(51) Int. Cl.
*H01L 27/00* (2006.01)
(52) U.S. Cl. ..................... 250/208.1; 250/239
(58) Field of Classification Search .............. 250/214.1, 250/239, 214 R, 226, 208.1; 257/67–72, 257/290–294, 440
See application file for complete search history.

(56) References Cited

U.S. PATENT DOCUMENTS

RE39,780 E * 8/2007 Kaifu et al. .................. 257/53

7,411,620 B2   8/2008 Taniguchi et al.
2005/0205958 A1   9/2005 Taniguchi et al.

FOREIGN PATENT DOCUMENTS

| JP | 2005-268609 A | 9/2005 |
|---|---|---|
| JP | 2007-67075 A | 3/2007 |

* cited by examiner

*Primary Examiner*—Que T Le
(74) *Attorney, Agent, or Firm*—Birch, Stewart, Kolasch & Birch, LLP

(57) ABSTRACT

An image sensor 1 has a substrate 2 and primary light-receiving pixels 4 arrayed in the direction of the surface of the substrate, and the primary light-receiving pixels are formed by laminating plural secondary light-receiving pixels 10, 20 and 30 which sense lights in different wavelength ranges, respectively, via at least sealing insulation layers 18 and 28 between adjacent secondary light-receiving pixels in the thickness direction. Each secondary light-receiving pixel includes a photoelectric conversion portion 14, 24, or 34 for photoelectrically converting the lights and a signal output portion 12, 22 or 32 for outputting signals from a thin film transistor 40 according to charges generated by the photoelectric conversion portion, and the active layer 48 of the thin film transistor is formed from an oxide semiconductor or organic semiconductor.

16 Claims, 4 Drawing Sheets

INCIDENT LIGHT

IMAGE SENSOR HAVING PLURAL PIXELS ADJACENT TO EACH OTHER IN A THICKNESS DIRECTION AND METHOD FOR MANUFACTURING THE SAME

CROSS REFERENCE TO RELATED APPLICATION

This application claims priority under 35 USC 119 from Japanese Patent Application No. 2007-238257, the disclosure of which is incorporated herein by reference.

BACKGROUND OF THE INVENTION

1. Field of the Invention

The present invention relates to an image sensor and a method of manufacturing the sensor, in particular, to an image sensor suitable for a contact image sensor, an image acquiring device and the like.

2. Description of the Related Art

As an image sensor, there is a type in which three kinds of light-receiving pixels that selectively receive lights in different wavelength ranges, for example, lights of three primary colors of red (R), green (G) and blue (B), respectively, are arrayed so as to be arranged on a substrate. In such an image sensor formed by arraying light-receiving pixels corresponding to the three primary colors of R, G and B, an image can be picked up in full color. However, the resolution of such an image sensor becomes one third as compared with the resolution of a monochromatic image sensor in which only the same kinds of light-receiving pixels are arrayed.

On the other hand, there is an image sensor formed by superposing image receiving pixels of R, G and B formed on separate substrates, respectively. Further, it has been proposed that an image sensor is formed by superposing image receiving pixels corresponding to two colors (for example, R and B) formed on both of the front and back surfaces of a single transparent substrate, and image receiving pixels corresponding to remaining one color (for example, G) formed on a separate substrate (for example, see, Japanese Patent Application Laid-Open No. 2007-67075). In this way, by superposing pixels corresponding to respective colors, an image pickup in full color can be attained and an improvement in resolution can be achieved. However, a gap equivalent to the thickness of the substrate (intermediate substrate) intervening between the light-receiving pixels is formed, resulting in a problem that images are apt to be blurred.

Further, it has been proposed that an image sensor in which a transmission and read-out circuit of a CMOS structure or a CCD structure is formed by a silicon (Si) semiconductor on a substrate, and light-receiving pixels corresponding to lights of R, G and B on the circuit are laminated via insulating layers, respectively (JP-A No. 2005-268609). In this case, it is considered that blurring of images can be prevented since a substrate having a larger thickness as compared with the insulating layer is not present between light-receiving pixels. However, it is difficult to manufacture such a multi-layer laminated image pickup device, since the electrode of each laminated light-receiving pixel is required to be connected to the transmission and read-out circuit formed on the substrate. Furthermore, since the transmission and read-out circuit formed on the substrate is made of a silicon semiconductor that requires a high temperature process, a flexible substrate made of plastic cannot be used.

SUMMARY OF THE INVENTION

A first aspect of the present invention provides an image sensor including: a substrate and primary light-receiving pixels arrayed in a surface direction of the substrate, wherein the primary light-receiving pixels are formed by laminating, on one surface of the substrate, a plurality of secondary light-receiving pixels which are respectively sensitive to light in different wavelength ranges, via at least a sealing insulation layer disposed between secondary light-receiving pixels which are adjacent to each other in a thickness direction; the plurality of secondary light-receiving pixels each include a photoelectric conversion portion that photoelectrically converts the light, and a signal output portion that outputs signals from a thin film transistor based on charges generated by the photoelectric conversion portion; and the thin film transistor includes a gate electrode, a gate insulation layer, an active layer, a source electrode and a drain electrode, and the active layer is formed from an oxide semiconductor or an organic semiconductor.

A second aspect of the present invention provides a method of manufacturing an image sensor comprising a substrate and primary light-receiving pixels arrayed in a surface direction of the substrate, the primary light-receiving pixels being formed by laminating a plurality of secondary light-receiving pixels respectively sensitive to lights in different wavelength ranges; the method including: laminating the plurality of the secondary light-receiving pixels sequentially on one surface of the substrate via at least a sealing insulation layer disposed between secondary light-receiving pixels which are adjacent to each other in the thickness direction; forming, when the plurality of secondary light-receiving pixels are formed, a photoelectric conversion portion that photoelectrically converts the light, and a signal output portion that outputs signals from a thin film transistor based on charges generated by the photoelectric conversion portion; and forming the thin film transistor to have a gate electrode, a gate insulation layer, an active layer, a source electrode and a drain electrode, the active layer being formed from an oxide semiconductor or an organic semiconductor.

DETAILED DESCRIPTION OF THE INVENTION

Hereinafter, embodiments of the invention will be explained with reference to the drawings.

Figure 1:
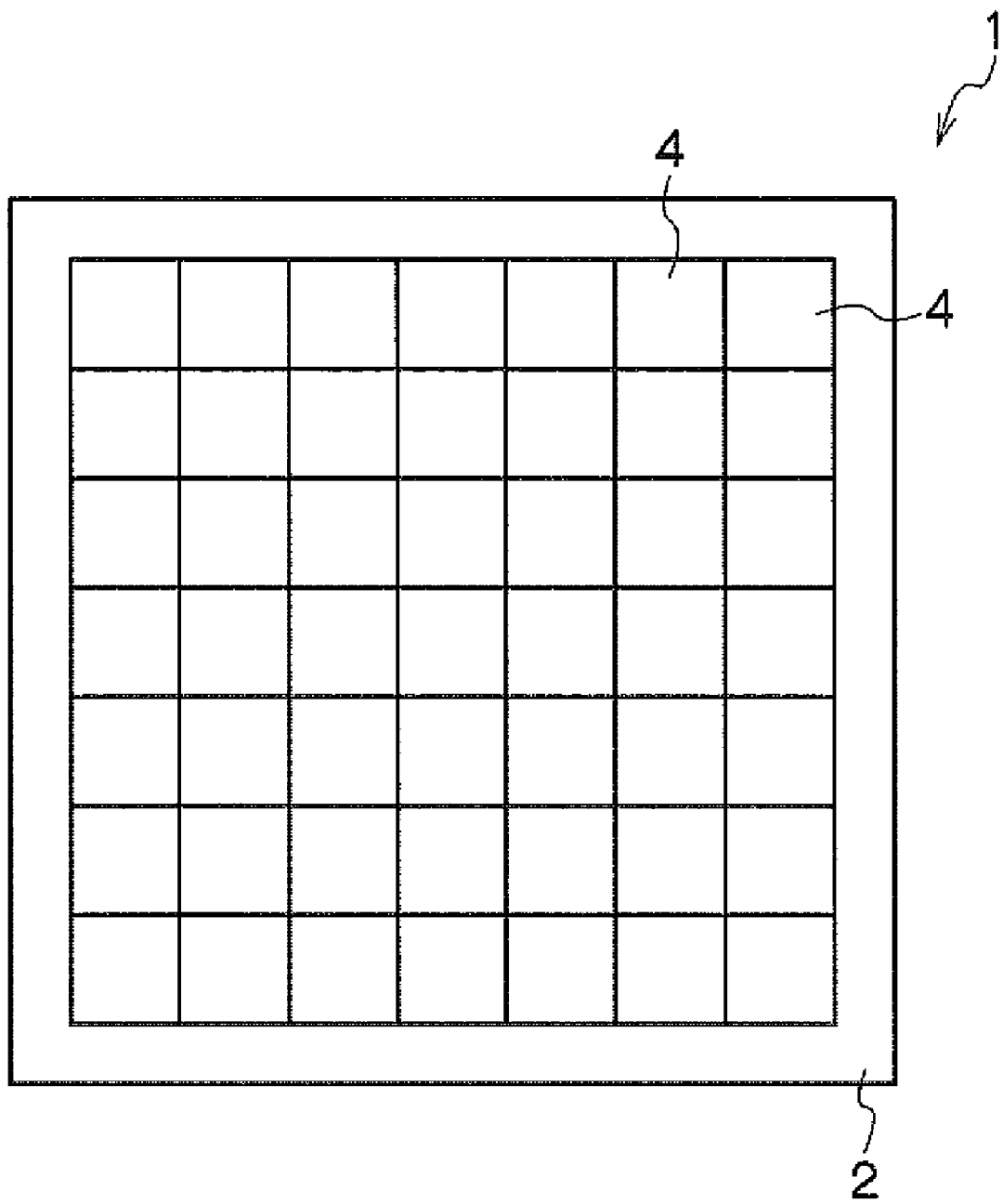
FIG. 1 is a schematic plan view showing an example of the array of primary light-receiving pixels of an image sensor according to the invention.
Figure 2:
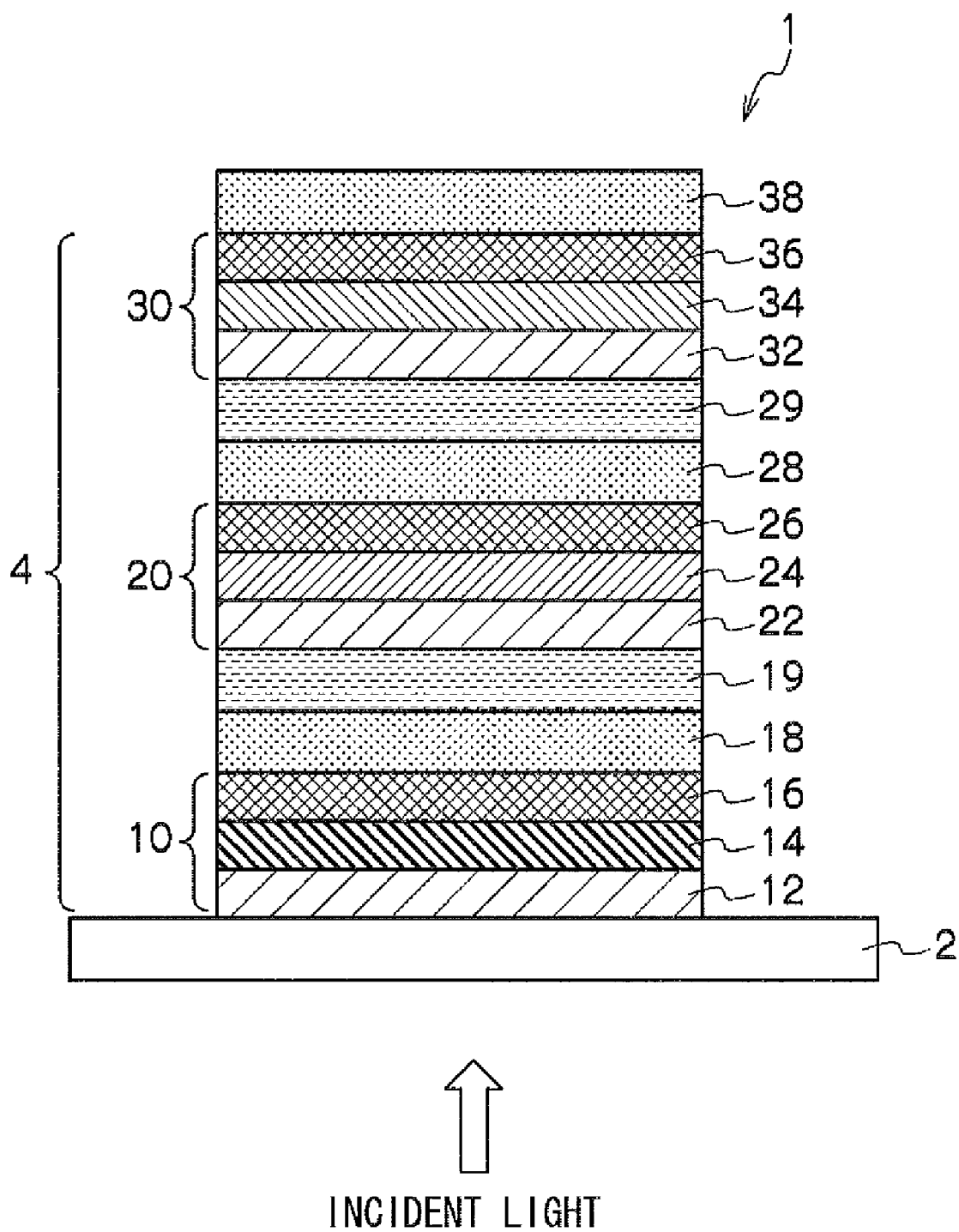
FIG. 2 is a schematic sectional view showing an example of the layer configuration of secondary light-receiving pixels constituting primary light-receiving pixels.

FIG. 1 is a schematic plan view showing an example of the array of primary light-receiving pixels 4 in a surface direction of a substrate 2 of an image sensor 1 according to one embodiment. FIG. 2 is a schematic sectional view showing an example of the layer configuration of secondary light-receiving pixels 10, 20 and 30 constituting the primary light-receiving pixels 4.

As shown in FIG. 2, the image sensor 1 according to the embodiment is formed by laminating sequentially three kinds of light-receiving pixels (secondary light-receiving pixels) 10, 20, and 30 which are selectively sensitive to lights in different wavelength ranges (B, G and R), respectively, on one surface of a substrate 2 in the thickness direction. Further, scaling insulation layers 18 and 28, and planarization layers 19 and 29 intervene between secondary light-receiving pixels which are adjacent to each other, respectively.

Figure 3:
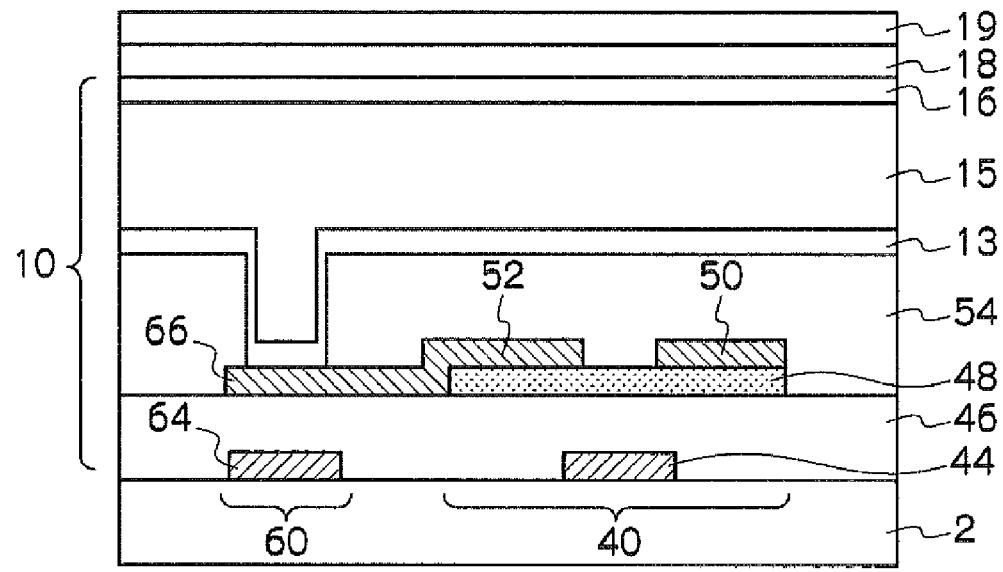
FIG. 3 is a schematic view showing an example of the configuration of first secondary light-receiving pixels in detail.

FIG. 3 shows a configuration of a first secondary light-receiving pixel 10 formed initially on the substrate 2 in more detail. The first secondary light-receiving pixel 10 is formed of an upper electrode 16, a photoelectric conversion portion 14 that selectively senses light in a predetermined wavelength range and photoelectrically converts the light, and a signal output portion 12 that outputs signals from a thin film transistor 40 based on charges generated by the photoelectric conversion portion 14. The thin film transistor 40 is formed of a gate electrode 44, a gate insulation layer 46, an active layer 48, a source electrode 50 and a drain electrode 52, and the active layer 48 is formed from an oxide semiconductor or an organic semiconductor.

On the other hand, second and third secondary light-receiving pixels 20 and 30 may have a configuration similar to the first secondary light-receiving pixel 10 except that materials for sensing lights in different wavelength ranges are used in the photoelectric conversion portions 24 and 34, respectively. Therefore, similarly, a thin film transistor or the like similar to the thin film transistor 40 or the like contained in the first secondary light-receiving pixel 10 is also contained in the second and third secondary light-receiving pixels 20 and 30. Hereinafter, the configuration of the first secondary light-receiving pixel 10 is mainly explained.

The primary light-receiving pixel 4 is formed by laminating the secondary light-receiving pixels 10, 20 and 30 for sensing the lights corresponding to B, G and R, respectively, on the above substrate 2 via the sealing insulation layers 18 and 28. The primary light-receiving pixels 4 are arranged, for example, in a matrix shape in the surface direction of the substrate 2, as shown in FIG. 1. The arrangement (array) in a matrix shape of the primary light-receiving pixels 4 as shown in FIG. 1 is advantageous from the viewpoint of enhancing resolution, but the array is not limited to this arrangement, and the array shape may be suitably determined in accordance with the resolution or the like to be required. Moreover, the size and the number of the primary light-receiving pixels 4 can also be determined according to the resolution to be required, and for example, the pixel density may be 200 ppi or more.

<Substrate>

Materials of the substrate 2 are not limited to particular materials, and examples of the materials include inorganic materials such as YSZ (zirconia stabilized yttrium) and glass, organic materials such as synthetic resins including polyesters such as polyethylene terephthalate, polybutylene terephthalate and polyethylenenaphthalate; polystyrene, polycarbonate, polyether sulfone, polyallylate, allyldiglycol carbonate, polyimide, polycycloolefin, norbornene resin, and poly (chlorotrifluoroethylene) and the like. In the case of the organic material, it is preferable that the organic material is superior in light transmittance, heat resistance, dimensional stability, surface smoothness, solvent resistance, electric insulation property, workability, low gas permeability, low hygroscopic property and the like.

Particularly, a flexible substrate can be preferably used for the image sensor 1 of this embodiment. As a material used for the flexible substrate 2, an organic plastic film with a high light transmittance is desirable, and the plastic film in the above organic materials can be preferably used. Moreover, it is also desirable to provide the substrate 2 with an insulating layer when the electric insulation is insufficient for the film plastic substrate 2, or with a gas barrier layer for preventing the penetration of moisture or oxygen, and with an undercoat layer for increasing in the flatness of the film plastic substrate 2 or increasing in adhesion of the thin film transistor 40 with the substrate 2.

Although the thickness of the substrate varies with materials when a flexible substrate is used, it is preferable that the substrate has a thickness for surely holding the light-receiving pixels and the like formed on the substrate 2, and a thickness capable of freely being bent, for example, from 20 μm to 1 mm, and preferably from 20 μm to 0.5 mm.

If such a flexible substrate 2 made from plastics is used, the substrate can be freely bent or rolled up, and can contribute to miniaturization and trimming-weight of the device.

When each of the second light pixels 10, 20, and 30 receives and senses light from the substrate 2 side as shown in FIG. 2, the substrate 2 with a high light transmittance is used. A higher light transmittance of the substrate 2 is preferable, although the transmittance varies with the sensitivity to be required. On the other hand, when each of the secondary light-receiving pixels 10, 20, and 30 receives light from the opposite side of the substrate 2, namely, from the third secondary light-receiving pixel 30 side, to perform a photoelectric conversion, the substrate 2 is not necessarily transparent, but an opaque substrate such as a metal substrate, semiconductor substrate and the like can be used.

<Thin Film Transistor>

The secondary light-receiving pixel 10 outputs a signal based on the charge generated by the photoelectrical conversion portion 14 from the signal output portion 12 including a capacitor 60 and a field effect thin film transistor 40. The thin film transistor 40 has a gate electrode 44, a gate insulation layer 46, an active layer 48, a source electrode 50, and a drain electrode 52, and the active layer 48 is formed from an oxide semiconductor or an organic semiconductor. The signal output portions 22 and 32 including a thin film transistor having a similar configuration, respectively, in the second and third secondary light-receiving pixels 20 and 30 are formed, and signals are outputted based on the charge generated from each photoelectrical conversion portion 24 and 34.

Figure 4:
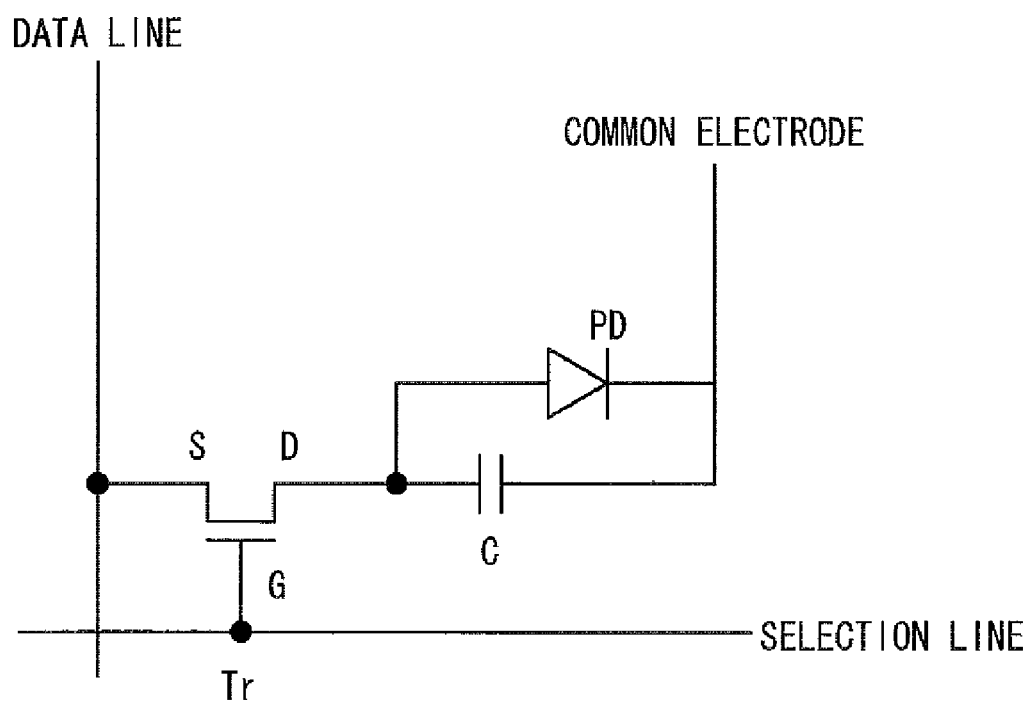
FIG. 4 is a drawing showing an example of the circuit structure of a thin film transistor contained in the secondary light-receiving pixels in one layer.

FIG. 4 schematically shows an example of a circuit configuration provided in a secondary light-receiving pixel in one layer in one primary light-receiving pixel 4. First, a gate electrode G of the thin film transistor Tr is selected through a selection line, and reverse bias voltage required for photoelectrical conversion is supplied to a photo-diode PD. In this state, light in a specific wavelength range incident from the substrate 2 side is received so that a photocurrent is generated in the photo-diode PD. The signal is read through a data line, and amplification with an amplifier, an analog signal processing, an AD conversion, a digital signal processing and the like are performed.

In addition, although at least one thin film transistor Tr may be formed in one secondary light-receiving pixel, two or more thin film transistors may also be formed. Further, the layout of the thin film transistor Tr and the capacitor C is not limited to the layout as shown in FIG. 4, but the layout can be appropriately designed. However, in any case, the active layer 48 is formed from an oxide semiconductor or an organic semiconductor.

-Active Layer-

If the active layer 48 is formed from an oxide semiconductor, the mobility of charge thereof can be much higher than that of an active layer made of amorphous silicon, and the device can be driven at a lower voltage. Further, if an oxide semiconductor is used, an active layer 48 with a higher light transmittance and flexibility than silicon can be formed. Moreover, it is particularly advantageous that a flexible resin substrate 2, such as one comprising plastic, is used, since an oxide semiconductor, in particular, an amorphous oxide semiconductor, can be uniformly layered at a low temperature (for example, room temperature). Moreover, upon laminating a plurality of secondary light-receiving pixels, when forming the secondary light-receiving pixels at an upper side, secondary light-receiving pixels at the lower side may be negatively affected. Particularly, a photoelectric conversion layer is easily affected by heat, but an oxide semiconductor, especially an amorphous oxide semiconductor, is advantageous since it may be layered at a low temperature.

As the oxide semiconductor for forming the active layer 48, an oxide comprising at least one of In, Ga, and Zn (for example, In—O type) is preferable, an oxide comprising at least two of In, Ga and Zn (for example, an In—Zn—O type, an In—Ga—O type, a Ga—Zn—O type) is more preferable, and an oxide comprising In, Ga, and Zn is still more preferable. As an In—Ga—Zn—O type oxide semiconductor an oxide semiconductor expressed by $InGaO_3 (ZnO)_m$ (m is a natural number less than six) in a composition in a crystallized state is preferable, and in particular, $InGaZnO_4$ is more preferable. The amorphous oxide semiconductor with this composition is characterized in that the mobility of electron tends to increase as the electroconductivity increases.

Here, the electroconductivity is the value of physical property indicating ease of occurrence of the electrical conduction of a substance, and when the carrier concentration of a substance is n, and the carrier mobility is μ, the electroconductivity σ of the substance is expressed by the following equation:

$$\sigma = ne\mu$$

When the active layer 48 is an n-type semiconductor, the carrier is an electron, and the carrier concentration refers to an electron carrier concentration, and the carrier mobility refers to an electron mobility. Similarly, when the active layer 48 is a p-type semiconductor, the carrier is a positive hole, the carrier concentration refers to a positive hole carrier concentration, and the carrier mobility refers to a positive hole mobility. In addition, the carrier concentration and carrier mobility of a substance can be obtained by the hole measurement.

The electroconductivity of a film can be determined by measuring the sheet resistance of the film, the thickness of which has been known. Although the electroconductivity of a semiconductor varies with temperature, the electroconductivity in this specification refers to an electroconductivity in room temperature (20° C.).

As an oxide semiconductor which forms the active layer 48, as described above, an n-type oxide semiconductor comprising at least one of In, Ga, and Zn is preferable, but a p-type oxide semiconductor such as $ZnO.Rh_2O_3$, $CuGaO_2$, and $SrCu_2O_2$ can also be used for the active layer 48.

The electroconductivity of the active layer 48 is preferably higher in the vicinity of the gate insulation layer 46 than the electroconductivity in the vicinity of the source electrode 50 and drain electrode 52 of the active layer 48. More preferably, the ratio of the electroconductivity in the vicinity of the gate insulation layer 46 to the electroconductivity in the vicinity of the source electrode 50 and drain electrode 52 (electroconductivity in the vicinity of the gate insulation layer 46/electroconductivity in the vicinity of the source electrode 50 and drain electrode 52) is preferably from $10^1$ to $10^{10}$, and more preferably, from $10^2$ to $10^8$. The electroconductivity in the vicinity of the interface of the active layer 48 with the gate insulation layer 46 is preferably $10^{-4}$ Scm$^{-1}$ or more and less than $10^2$ Scm$^{-1}$, and is more preferably, $10^{-1}$ Scm$^{-1}$ or more and less than $10^2$ Scm$^{-1}$.

Figure 5:
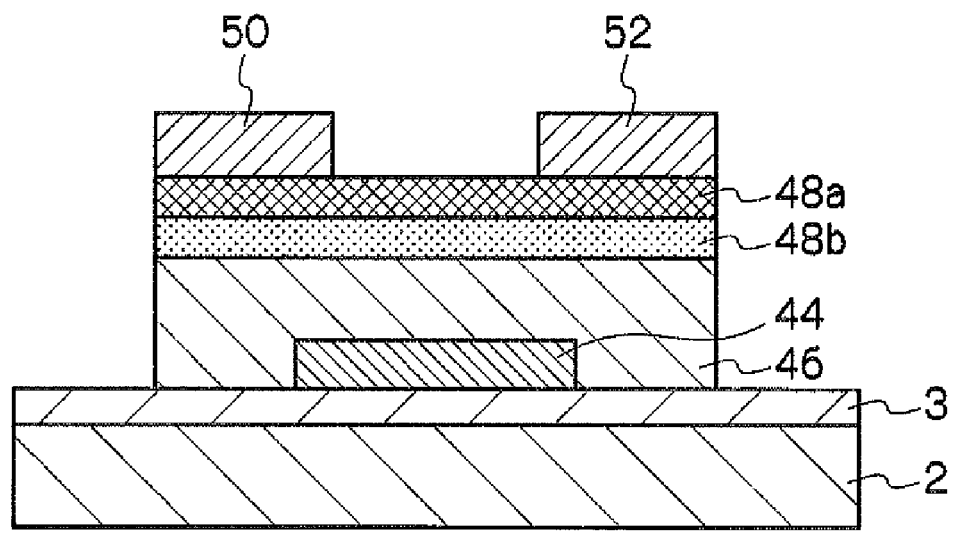
FIG. 5 is a schematic sectional view showing an example (bottom gate type) of a thin film transistor having an active layer with a two-layer structure.

The active layer 48 can also be formed of two or more layers. For example, as shown in FIG. 5, the active layer 48 has a first region 48a and a second region 48b in which the electroconductivity of the second region 48b is larger than the electroconductivity of the first region 48a, and it is preferable that the second region 48b has a configuration where the second region 48b is in contact with the gate insulation layer 46, and the first region 48a is electrically connected to the second region 48b, and at least one of the source electrode 50 and the drain electrode 52. More preferably, the ratio of the electroconductivity of the second region 48b to the electroconductivity of the first region 48a (the electroconductivity of the second active layer region 48b/the electroconductivity of the first active layer region 48a) is from $10^1$ to $10^{10}$, and more preferably, $10^2$ to $10^8$.

Moreover, the electroconductivity of the second region 48b is preferably $10^{-4}$ Scm$^{-1}$ or more, and less than $10^2$ Scm$^{-1}$, and is more preferably $10^{-1}$ Scm$^{-1}$ or more, and less than $10^2$ Scm$^{-1}$. The electroconductivity of the first region 48a is preferably $10^{-1}$ Scm$^{-1}$ or less, and is more preferably from $10^{-9}$ Scm$^{-1}$ to $10^{-3}$ Scm$^{-1}$.

If the active layers 48a and 48b having a two-layer structure are formed from amorphous oxide semiconductors such as above IGZO and the like, a TFT having a mobility of 10 cm$^2$/(V·second) or higher, and a transistor property with an ON/OFF ratio of $10^6$ or higher can be realized, so that a further lower voltage can be attained.

Moreover, either a bottom gate type or a top gate type may be used for the thin film transistor provided in each of the secondary light-receiving pixels 10, 20 and 30. For example, as shown in FIG. 6, the thin film transistor may be constituted by laminating source-drain electrodes 50 and 52, active layers 48a and 48b, a gate insulation layer 46 and a gate electrode 44, sequentially in this order from a substrate 2 side.

Figure 6:
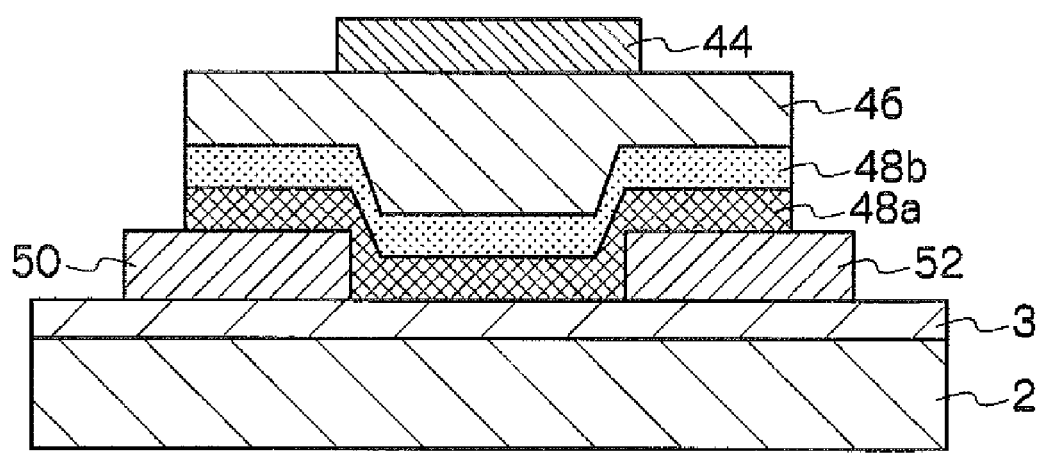
FIG. 6 is a schematic sectional view showing another example (top gate type) of a thin film transistor having an active layer with a two-layer structure.

In addition, in FIGS. 5 and 6, an insulation layer 3 is formed on a substrate 2, and the thin film transistor is formed on the insulation layer 3. In particular, when an electroconductive substrate such as a metal substrate and a semiconductor substrate is used, such an insulation layer can be formed to obtain an insulation substrate.

In the active layer 48 according to the invention as mentioned above, it is desirable to adjust such that the electroconductivity of the active layer 48 in the vicinity of the gate insulation layer 46 becomes higher than the electroconductivity of the active layer 48 in the vicinity of the source electrode 50 and drain electrode 52. When forming the active layer 48 from an oxide semiconductor, the following methods can be exemplified as adjustment methods of the electroconductivity.

(1) Adjustment by Oxygen Defect

It is known that if an oxygen defect arises in the oxide semiconductor, a carrier electron is generated so that the electroconductivity becomes higher. Accordingly, it is possible to control the electroconductivity of an oxide semiconductor by adjusting the amount of oxygen defects. Concrete methods of controlling the amount of oxygen defects include the control of the oxygen partial pressure during layer forming, the oxygen concentration and treatment time at the time of post-treatment after layer forming, and the like. Here, the post-treatment specifically includes a heat treatment at 100° C. or more, an oxygen plasma treatment, an UV ozone treatment, and the like. Among these methods, the method of controlling the oxygen partial pressure during layer forming is preferable from the viewpoint of productivity. The electroconductivity of the oxide semiconductor can be controlled by adjusting the oxygen partial pressure during layer forming.

(2) Adjustment by Composition Ratio

The electroconductivity can also be changed by changing the composition ratio of metal in an oxide semiconductor For example, when the ratio of Mg in $InGaZn_{1-x}Mg_xO_4$ increases, the electroconductivity becomes lower. Further, in the oxide system of $(In_2O_3)_{1-x}(ZnO)_x$, it is reported that the electroconductivity becomes low as Zn ratio in Zn/In ratio of 10% or more increases ("New Deployment II of Transparent Electroconductive Film", CMC publication, pp., 34-35). As concrete methods of changing these composition ratios, for example, in the layer forming method by sputtering, a method of using targets with different composition ratios is exemplified. Alternatively, it is possible to change the composition ratio of the layer by co-sputtering with multi-targets in which the sputtering rates thereof are individually adjusted.

(3) Adjustment with Impurities

It is possible to reduce the concentration of the electron carrier, i.e., reduce in electroconductivity, by adding elements such as Li, Na, Mn, Ni, Pd, Cu, Cd, C, N and P, as an impurity to an oxide semiconductor.

Methods of adding an impurity include a method of co-depositing an oxide semiconductor and an impurity element, and a method of ion-doping an ion of impurity element into a formed oxide semiconductor layer.

(4) Adjustment with Oxide Semiconductor Material

In (1)-(3) in the above, although the adjustment methods of the electroconductivity in the same oxide semiconductor systems are described, the electroconductivity can be changed, of course, by changing oxide semiconductor materials. For example, it is known that $SnO_2$ system oxide semiconductor has generally a lower electroconductivity as compared with $In_2O_3$ system oxide semiconductor. Thus, the electroconductivity can be adjusted by changing oxide semiconductor materials.

As a method of forming the active layer 48, the vapor phase layer forming method with the use of a polycrystal sintered body of an oxide semiconductor as a target is preferred. Among the vapor phase layer forming methods, the sputtering method and the pulsed laser vapor-deposition method (PLD method) are suitable. Furthermore, from the viewpoint of mass productivity, the sputtering method is desirable.

For example, the active layer 48 is formed by controlling a degree of vacuum and an oxygen flow rate by the RF magnetron sputtering vapor-deposition method. The electroconductivity can be lowered as the oxygen flow rate increases.

In addition, at the time of layer-forming, as a means for adjusting the electroconductivity, the method of (1)-(4) in the above may be used singly, or in combination.

The formed layer, for example, can be determined as to whether the layer is an amorphous layer by the use of a well-known X-ray diffraction method.

Further, the layer thickness can be determined by a contact probe type surface profile measurement method. The composition ratio of the layer can be determined by the RBS (Rutherford back scattering) analysis method.

The active layer 48 may be formed from an organic semiconductor. Organic semiconductors such as condensed polycyclic aromatic compounds or conjugated compounds, which can form a layer at a low temperature and are electroconductive and light-transmissive, can be used.

Specifically, low molecular organic semiconductors include acene compounds exemplified by pentacene, tetracene and anthracene; phthalocyanines with divalent metal such as Cu, Zn, Co, Ni, Pb, Pt, Fe and Mg as a central metal; or phthalocyanines with no metal; trivalent metal phthalocyanines coordinated with a halogen atom such as aluminum chlorophthalocyanine, indium chlorophthalocyanine and gallium chlorophthalocyanine; phthalocyanine pigments exemplified by phthalocyanines coordinated with oxygen such as vanadyl phthalocyanine and titanyl phthalocyanine; indigo or thioindigo pigments; quinacridone pigments; perylene or perylene pigments such as PTCDA, PTCDI,PTCBI and Me-PTC; fullerenes such as C60, C70, C76, C78, C84; carbon nanotubes; and dyes such as merocyanines.

Examples of polymer organic semiconductors include polymers such as polypyrroles such as polypyrrole and poly (N-substituted pyrrole); polythiophenes such as polythiophene and poly(3-substitued thiophene); polyacetylenes; polyvinyl carbazole; polyphenylene sulfide; and polyvinylene sulfide.

The above materials may be used alone, or may be used by dispersing and mixing the materials in binders such as resins.

Further, in order to adjust the electroconductivity of the organic semiconductor, inorganic materials with donor or acceptor characteristics, or dopants such as inorganic compounds and organic compounds may be doped.

As a method of forming the active layer 48 from an organic semiconductor, a dry formation method or a wet formation method can be used. Examples of the dry formation methods include physical vapor phase growth methods such as a vacuum deposition method, a sputtering method, an ion plating method and an MBE method, and CVD methods such as plasma polymerization. Examples of the wet formation method include coating methods such as a cast method, a spin coat method, a dipping method and an LB method. Further, printing methods such as an ink jet printing method and a screen printing method, or transfer methods such as a thermal transfer method and a laser transfer method may be used. Patterning may be performed by chemical etching by means of a photolithography and the like, or physical etching by means of ultraviolet radiation, laser beam, and the like, or by vacuum deposition or sputtering with superposition of a mask, or by a lift-off method, printing method, transfer method or the like.

When low molecular organic semiconductors are used, the dry formation method is preferably used, and in particular, a vacuum deposition method is preferably used. In the vacuum deposition method, fundamental parameters are a method of heating of compounds, the shape of the deposition source such as a crucible or boat, and the degree of vacuum, the temperature of vapor deposition, the temperature of substrate, the velocity of vapor deposition, in the resistance heating vapor deposition method, the electron beam heating vapor deposition method or the like. In order to enable a uniform vapor deposition, it is preferable that the vapor deposition is preformed while the substrate 2 is being rotated. A higher degree of vacuum is desirable, and the vapor deposition is performed under $10^{-4}$ Torr or less, preferably $10^{-6}$ Torr or less, and more preferably $10^{-8}$ Torr or less. All the processes at the time of the vapor deposition are desirably carried out in vacuum so that the compounds are fundamentally not brought into direct contact with oxygen and moisture in the atmosphere. Since the above conditions of the vacuum deposition influence the crystallinity, amorphouosness, density, closeness and the like of the organic layer, it is necessary to control the conditions strictly. It is desirable to control the velocity of the vapor deposition with PI or PID using a thickness monitor such as a quartz resonator and an interferometer. When vapor-depositing two or more kinds of compounds simultaneously, the co-deposition method, the flush deposition method, and the like can preferably be used.

When using a polymer semiconductor, it is desirable to form a layer by the wet formation method. When a layer is formed using the dry formation method such as vapor deposition, it is difficult to use a polymer because there is a possibility of decomposition. The oligomer is preferably used in place of the polymer.

Although the thickness of the active layer 48 varies with the material to be used, the thickness is preferably from 10 nm to 1 µm, more preferably from 20 nm to 500 nm, and particularly preferably from 30 nm to 200 nm.

-Gate Insulation Layer-

An inorganic compound and organic compound with a high relative dielectric constant can be used for the gate insulation layer 46.

As inorganic compounds, silicon oxide, silicon nitride, germanium oxide, and germanium nitride, aluminum oxide, aluminum nitride, yttrium oxide, tantalum oxide, hafnium oxide, silicon nitride oxide, silicon carbide oxide, silicon carbide nitride, silicon carbide nitride oxide, germanium nitride oxide, germanium carbide oxide, germanium carbide nitride, germanium carbide nitride oxide, aluminum nitride oxide, aluminum carbide oxide, aluminum carbide nitride, aluminum carbide nitride oxide, or the mixtures thereof can be used.

As organic compounds, polyimides, polyamides, polyesters, polyacrylates, photocurable resins of photoradical polymerization system and photo-cationic polymerization system, or copolymers containing an acrylonitrile component, polyvinylphenol, polyvinyl alcohol, novolak resins, cyano ethyl pullulan, and the like can also be used. Further, fine particles of these polymers coated with inorganic oxides may also be used.

As the method of forming the gate insulation layer 46, the dry formation method or the wet formation method can be used. Concrete examples of the dry formation method include physical vapor phase growth methods such as a vacuum deposition method, a sputtering method, an ion plating method and an MBE method, and CVD methods such as plasma polymerization. Examples of the wet formation method include coating methods such as a cast method, a spin coat method, a dipping method and an LB method. Further, printing methods such as an ink jet printing method and a screen printing method, or transfer methods such as a thermal transfer method and a laser transfer method may be used. Patterning may be performed by chemical etching by means of photolithography and the like, or physical etching by means of ultraviolet radiation, laser beam and the like, or by vacuum deposition or sputtering with superposition of a mask, or by a lift-off method, printing method or transfer method.

Moreover, although depending on the structure of the TFT 40, the gate insulation layer 46 can also be formed in such a manner that the surface of the gate electrode 44 is subjected to an $O_2$ plasma treatment or anodic oxidation to oxidize the surface, or to an $N_2$ plasma treatment to nitride the surface.

The thickness of the gate insulation layer 46 is preferably from 30 nm to 3 µm, and more preferably from 50 nm to 1 µm.

-Gate Electrode, Source Electrode and Drain Electrode-

The materials of the gate electrode 44, the source electrode 50, and the drain electrode 52 are not specifically limited, as long as these electrode are formed from electroconductive materials, for example, and are platinum, gold, silver, and nickel, chromium, copper, iron, tin, antimony, lead, tantalum, indium, aluminum, zinc, magnesium, and alloys of these metals, electroconductive metal oxides such as indium tin oxide (ITO), indium zinc oxide (IZO) and the like, inorganic or organic semiconductors (silicon monocrystal, polysilicon, amorphous silicon, germanium, graphite, polyacethylene, polyparaphenylene, polythiophene, polypyrrole, polyaniline, polythienylenevinylene, polyparaphenylene vinylene and the like) with an increased electroconductivity by being doped or the like and the composites of these materials. In particular, materials of the electrode used for the source region and drain region have preferably a lower electric resistance at the contact surface with the active layer 48 among the above materials.

When a flexible substrate made of plastics is used, it is desirable to form each of the electrodes 44, 50 and 52 using conductive metal oxides capable of forming a layer at a low temperature such as, for example, indium tin oxide, (ITO), and indium zinc oxide (IZO), or using organic semiconductors with a higher electric conductivity by being doped. If such materials are used, the thin film transistor 40 as a whole can be formed at a low-temperature process, the thin film transistor 40 with a higher light transmittance and flexibility can be formed as well. In addition, the higher the light transmittance of thin film transistor 40, the more preferable the thin film transistor 40 is; specifically, the visible light transmittance of the thin film transistor 40 is preferably 60% or more, more preferably 70% or more, and particularly preferably 80% or more. As the light transmittance of the thin film transistor 40 in each of the secondary light-receiving pixels 10, 20 and 30 increases, the quantity of light received by the photoelectrical conversion layer 15 also increases, and higher sensitivities can be achieved thereby.

Further, if the electrodes 13 and 16 of the photoelectrical conversion portion (light-receiving element) 14 are also formed from the material capable of forming a layer at a low temperature as above, the whole secondary light-receiving pixel can surely be formed at a low-temperature process, to become particularly advantageous in the case of use of the flexible substrate 2.

As the method of forming the gate electrode 44, the dry formation method or the wet formation method can be used. Concrete examples of the dry formation method include physical vapor phase growth methods such as a vacuum deposition method, a sputtering method, an ion plating method and an MBE method, and CVD methods such as plasma polymerization. Examples of the wet formation method include coating methods such as a cast method, a spin coat method, a dipping method and an LB method. Further, printing methods such as an ink jet printing method and a screen printing method, or transfer methods such as a thermal transfer method and a laser transfer method may be used.

Patterning may be performed by chemical etching by means of photolithography and the like, or physical etching by means of ultraviolet radiation, laser beam and the like, or by vacuum deposition or sputtering with superposition of a mask, or by a lift-off method, printing method or transfer method. Suitable methods are appropriately selected from the layer forming methods and patterning methods in consideration of materials to be used, materials of the substrate 2 and the like.

The source electrode 50 and the drain electrode 52 can be formed in a manner similar to the method for forming the gate electrode 44.

The layer thickness of the gate electrode 44, the source electrode 50 and the drain electrode 52 is preferably from 10 nm to 1 μm, more preferably from 30 nm to 500 nm and particularly preferably from 50 nm to 200 nm, respectively.

<Capacitor>

A capacitor 60 is electrically connected to a lower electrode (pixel electrode) 13 corresponding to the capacitor 60 through a wiring of an electroconductive material formed by passing through the insulated layer 54 disposed between the substrate 2 and the lower electrode 13. As a result, the charges collected in the lower electrode 13 can be transferred to the capacitor 60.

The capacitor 60 is formed of a pair of insulated electrodes 64 and 66, and, for example, the capacitor 60 can be formed by patterning with the photolithography or the like at the same time when the gate electrode 44, the gate insulation layer 46, and the source and drain electrodes 50 and 52 of the thin film transistor 40 are formed. At this time, the patterning is carried out so as to electrically connect the upper electrode 66 of the capacitor 60 to the drain electrode 52.

<Intermediate Insulation Layer>

After forming the thin film transistor 40 and the capacitor 60, a protective layer (intermediate insulation layer) 54 is formed. Inorganic compounds and organic compounds similar to those of the gate insulation layer 46 can also be used for the intermediate insulation layer 54.

As the method of forming the intermediate insulation layer 54, the dry formation method or the wet formation method can be used. Concrete examples of the dry formation method include physical vapor phase growth methods such as a vacuum deposition method, a sputtering method, an ion plating method and an MBE method, and CVD methods such as plasma polymerization. Examples of the wet formation method include coating methods such as a cast method, a spin coat method, a dipping method and an LB method. Further, printing methods such as an ink jet printing method and a screen printing method, or transfer methods such as a thermal transfer method and a laser transfer method may be used. Pattering may be performed by chemical etching by means of photolithography and the like, or physical etching by means of ultraviolet radiation, laser beam and the like, or by vacuum deposition or sputtering with superposition of a mask, or by a lift-off method, printing method or transfer method.

For example, an acrylic photosensitive resin is coated on a substrate 2 with a spin coater or the like, and the coated layer is exposed to light so as to form contact holes at predetermined positions and developed. In this manner, the protective layer (intermediate insulation layer) 54 having contact holes can be formed.

The thickness of the intermediate insulation layer 54 is preferably from 50 nm to 3 μm, and more preferably from 100 nm to 1 μm.

<Lower Electrode and Upper Electrode>

One of the lower electrode (pixel electrode) 13 and the upper electrode (counter electrode) 16 to form a photoelectric conversion portion (light-receiving element) forms an anode, and the other forms a cathode.

It is necessary that the lower electrode and the upper electrodes 16, 26 and 36 in the secondary light-receiving pixels 10, 20 and 30, respectively, are transparent or translucent, except for the upper electrode 36 of the third secondary light-receiving pixel 30, where incident light reaches lastly, and the lower electrode 16 and the upper electrodes 26 have a light transmittance of at least 50%, more preferably 70% or more and furthermore preferably 90% or more in the visible light wavelength range of from 400 nm to 700 nm.

The materials of these electrodes are selected in consideration of adhesiveness with the layer adjacent to the electrode, electron affinity, ionization potential, stability and the like in addition to the transmittance and electroconductivity, and metals, alloys, metal oxides, electroconductive compounds, or mixed materials thereof can be used.

Specifically, examples of the materials include electroconductive metal oxides such as tin oxide, zinc oxide, indium oxide, indium tin oxide (ITO), IZO, AZO, FTO, $SnO_2$, $TiO_2$, $ZnO_2$ or the like; metals such as gold, silver, chromium, nickel or the like, the mixtures or laminated materials of these metals with the electroconductive metal oxides; inorganic electroconductive materials such as copper iodide, copper sulfide or the like; organic electroconductive materials such as polyaniline, polythiophene, polypyrrole or the like; silicon compounds, and the laminated materials of these materials with ITO. Materials for the electrodes which require a high light transmittance are preferably electroconductive metal oxides, and from the viewpoint of the productivity, electroconductivity and transparency, ITO and IZO are particularly preferable.

As the methods of forming the lower electrode (pixel electrode) 13 and the upper electrode (counter electrode) 16, the dry formation method or the wet formation method can be used. Concrete examples of the dry formation method include physical vapor phase growth methods such as a vacuum deposition method, a sputtering method, an ion plating method and an MBE method, and CVD methods such as plasma polymerization. Examples of the wet-layer forming method include coating methods such as a cast method, a spin coat method, a dipping method and an LB method. Further, printing methods such as an inkjet printing method and a screen printing method, or transfer methods such as a thermal transfer method and a laser transfer method may be used. Patterning may be performed by chemical etching by means of photolithography or the like, or physical etching by means of ultraviolet radiation, laser beam or the like, or by vacuum deposition or sputtering with superposition of a mask, or by a lift-off method, printing method or transfer method.

The lower electrode (pixel electrode) 13 may be divided into respective primary light-receiving pixels by patterning after layer formation, and the upper electrode (counter electrode) 16 may have a single sheet configuration of all pixel portions, or may be divided into respective primary light-receiving pixels.

Although the layer thickness of the electrodes 13 and 16 can be appropriately selected depending upon materials to be used, it is preferable that the thickness is as thin as possible, in order to raise the light transmittance of the layer, and the thickness of the layer is preferably in the range of from 3 nm to 500 nm, more preferably from 5 nm to 300 nm, and still more preferably from 7 nm to 100 nm Further, it is preferable that the sheet resistance of the anode and cathode is as low as possible, and several hundred $\Omega/\square$ or less is desirable.

<Photoelectrical Conversion Layer>

The photoelectrical conversion layer 15 in the photoelectric conversion portion 14 is constituted such that the three kinds of laminated secondary light-receiving pixels 10, 20 and 30 sense lights in different wavelength ranges, respectively, to perform photoelectrical conversion.

For example, when visible light of blue light (for example, wavelengths of from 400 nm to 500 nm), green light (for example, wavelengths of from 500 nm to 600 nm), or red light (for example, wavelengths of from 600 nm to 700 nm) incident from the substrate 2 side is selectively absorbed by the secondary light-receiving pixels 10, 20 or 30, respectively, to perform photoelectrical conversion, the first secondary light-receiving pixel 10 is constituted such that the blue light is absorbed and photoelectrically converted by the first secondary light-receiving pixel 10, and the green and red lights pass through the first secondary light-receiving pixel 10. The second secondary light-receiving pixel 20 is constituted such that the green light is absorbed and photoelectrically converted by the second secondary light-receiving pixel 20, and the red light passes through the second secondary light-receiving pixel 20. In addition, since the light in the blue wavelength range has already been absorbed by the first secondary light-receiving pixel 10 and does not reach the second secondary light-receiving pixel 20, the second secondary light-receiving pixel 20 may absorb green light and blue light. Furthermore, the third secondary light-receiving pixel 30 is constituted such that at least the red light is absorbed, and photoelectrically converted by the third secondary light-receiving pixel 30. In addition, since the blue and green light have already been absorbed by the first and second secondary light-receiving pixels 10 and 20 and do not reach the third secondary light-receiving pixel 30, the third secondary light-receiving pixel 30 may absorb all of the lights in the three primary color ranges.

In each photoelectrical conversion layer of the secondary light-receiving pixels 10, 20 and 30, a photoelectrical conversion material which absorbs the light in a predetermined wavelength range, respectively, and generates an electric charge according to the intensity of the light, can be used. Specifically, for example, porphyrin derivatives as organic materials which absorb blue light to convert the light photoelectrically, for example, perylene derivatives as organic materials which absorb green light to convert the light photoelectrically, and for example, phthalocyanine derivatives as organic materials which absorb red light to convert the light photoelectrically, are exemplified.

In addition, organic materials which constitute the photoelectrical conversion layers are not limited to the above materials. For example, acridine, coumarin, quinacridone, cyanine, squarilium, oxazine, xanthene triphenylamine, benzidine, pyrazoline, styrylamine, hydrazone, triphenylmethane, carbazole, polysilane, thiophene, polyamine, oxadiazole, triazole, triazine, quinoxaline, phenanthroline, fullerene, aluminum quinoline, polyparaphenylenevinylene, polyfluorene, polyvinyl carbazole, polythiol, polypyrrole and polythiophene, and the derivatives of these compounds, can be layered singly, or two or more kinds of organic materials represented by these compounds can be mixed or layered to form the photoelectrical conversion layer 15.

Moreover, the photoelectrical conversion layer 15 may be formed from organic and inorganic material admixtures or inorganic materials.

As the method of forming the photoclectrical conversion layer 15, the dry formation method or the wet formation method can be used. Concrete examples of the dry formation method include physical vapor phase growth methods such as a vacuum deposition method, a sputtering method, an ion plating method and an MBE method, and CVD methods such as plasma polymerization. Examples of the wet formation method include coating methods such as a cast method, a spin coat method, a dipping method and an LB method. Further, printing methods such as an ink jet printing method and a screen printing method, or transfer methods such as a thermal transfer method and a laser transfer method may be used. Patterning may be performed by chemical etching by means of photolithography or the like, or physical etching by means of ultraviolet radiation, laser beam or the like, or by vacuum deposition or sputtering with superposition of a mask, or by a lift-off method, printing method or transfer method.

Moreover, it is also possible to mix or laminate an electron transport material, a hole transport material, an electron blocking material, a hole blocking material and the like in order to reduce dark current (current observed at the time when light is not irradiated) or improve quantum efficiency. These layers can also be formed by a method similar to that of the photoelectrical conversion layer 15.

When the laminated secondary light-receiving pixels 10, 20 and 30 are configured to receive lights of three primary colors, the layers are not limited to the above order of blue light, green light, and red light (BGR) from the substrate 2 side, but each of three kinds of secondary light-receiving pixels 10, 20 and 30 can individually and selectively sense any of the lights in the wavelength ranges corresponding to R, G or B, respectively, and the lights of the three primary colors can be photoelectrically converted by the combination thereof. Accordingly, the photoelectrical conversion layer 15 is formed such that three kinds of secondary light-receiving pixels 10, 20 and 30 may respectively absorb colored lights configured to have any of the patterns BGR, BRG, GBR, GRB, RGB or RBG from the substrate 2 side, such that they may be photoelectrically converted.

<Sealing Insulation Layer>

After forming the upper electrode 16 on the photoelectrical conversion layer 15, sealing insulation layers 18 and 28 are formed. The sealing insulation layers 18 and 28 are formed from an electric-insulative and light-transmissive material. For example, as materials for forming the sealing insulation layers 18 and 28, the same materials as the above gate insulation layer 46 or the intermediate insulation layer 54 may be used, but inorganic compounds can preferably be used. Examples of the inorganic compounds for forming the sealing insulation layer include inorganic materials such as $Al_2O_3$, $SiO_2$, $TiO_2$, $ZrO_2$, MgO, $HfO_2$, $Ta_2O_5$, and SiO (silicon oxide), SiON (silicon nitride oxide), or SiN (silicon nitride) or AlN (aluminum nitride). Further, the sealing insulation layers 18 and 28 are preferably inorganic material layers formed by the atomic layer CVD method (the ALCVD method).

The sealing insulation layers 18 and 28 are formed such that the sealing insulation layer 18 which intervenes between the first and second secondary light-receiving pixels 10 and 20 transmits the lights (G and R), which are sensed by the second and third secondary light-receiving pixels 20 and 30, respectively, and the sealing insulation layer 28 which intervenes between the second and third secondary light-receiving pixels 20 and 30 transmits the light (R), which is sensed by third secondary light-receiving pixel 30.

As the method for forming the sealing insulation layers 18 and 28, the dry formation method or the wet formation method similar to the method for forming the gate insulation layer 46 or the intermediate insulation layer 54 in the above can be used, by selecting in consideration of the material to be used and the material of the substrate 2 and the like.

The layer thickness of the sealing insulation layers 18 and 28 is preferably from 50 nm to 10 μm, more preferably from 70 nm to 5 μm, and particularly preferably from 100 nm to 3 μm. If such sealing insulation layers 18 and 28 are formed between secondary light-receiving pixels which are adjacent to each other, each of the secondary light-receiving pixels 10, 20 and 30 can be maintained at an insulated state, and can be controlled independently. Moreover, the thickness of the sealing insulation layers 18 and 28 can be very thin as compared with the substrate 2 which supports the whole light-receiving pixels. That is, since an intermediate substrate is not used in the image sensor 1 according to the invention, the gaps among the secondary light-receiving pixels 10, 20 and 30 are extremely small, so that blurring of images can effectively be prevented.

<Flattening Layer>

The secondary light-receiving pixels adjacent in the thickness direction are preferably laminated via planarization layers 19 and 29 provided on the sealing insulation layers 18 and 28 in addition to via the sealing insulation layers 18 and 28 themselves. For example, when forming the thin film transistor 40 in the first secondary light-receiving pixel 10, since the patterning is performed by the photolithography or the like, asperities are formed on the surface of the thin film transistor 40, and the surface of the sealing insulation layer 18 corresponds to the asperities on the surface of the thin film transistor 40, so that asperities may also be formed on the surface of the sealing insulation layer 18. When the thin film transistor or the like of the next secondary light-receiving pixel 20 is formed on the sealing insulation layer 18 on which such asperities have been formed, poor layer formation, layer thickening and the like may result. Accordingly, if a planarization layer 19 is formed to enhance flatness after the formation of the sealing insulation layer 18 on the first secondary light-receiving pixel 10, and prior to the formation of the next secondary light-receiving pixel 20, poor layer formation of a thin film transistor or the like in the next secondary light-receiving pixel 20 can be effectively prevented. Similarly, after forming the second secondary light-receiving pixel 20, it is desirable to form thereupon the sealing insulation layer 28 and the planarization layer 29 sequentially. It is not necessary to provide an additional planarization layer after forming the sealing insulation layer 38 on the third secondary light-receiving pixel 30 (upper electrode 36) as the top layer.

The planarization layers 19 and 29 are formed from an insulative and light-transmissive material. Specifically, it is desirable to use materials similar to the materials used for the gate insulation layer 46 or the intermediate insulation layer 54, and in particular, to use organic compounds.

Although the dry formation method or the wet formation method can be used as a method of forming the planarization layers 19 and 29, the wet formation method is desirable, and, specifically, a cast method, a spin coat method, a dipping method, a bar coat method, a roller coat method, a spray coat method, and the like are exemplified. According to such a method, even if asperity is formed on the sealing insulation layers 18 and 28, a planarization layer with a high flatness can be formed. In addition, examples of the dry formation methods include various CVD methods, for example, a plasma assisting method, an IPC-CVD method, a Cat-CVD method, an atomic layer CVD method (ALCVD method) and the like.

The thickness of the planarization layers 19 and 29 is preferably from 50 nm to 10 μm, more preferably from 70 nm to 5 μm, and particularly preferably from 100 nm to 3 μm. The planarization layers 19 and 29 with such thickness can improve the flatness, and the reduction in the light transmittance and increase in the gap between secondary light-receiving pixels can effectively be prevented.

Here, the material of the sealing insulation layers 18 and 28 can be the same material as the material of the planarization layers 19 and 29, and the sealing insulation layers 18 and 28 serving as the planarization layers 19 and 29 may be formed. For example, if a multi-layered structure is formed by means of a plasma CVD method using SiN (silicon nitride) and SiO (silicon oxide), the sealing insulation layers 18 and 28 with a high transmittance, a high flatness, a close density, and a barrier property compatible with flexibility can be formed.

In the above methods, three kinds of the secondary light-receiving pixels 10, 20 and 30 which selectively sense lights in different wavelength ranges (BGR), respectively, are sequentially formed in layers on one surface of the substrate 2, via at least the sealing insulation layer 18 or 28 disposed between secondary light-receiving pixels which are adjacent to each other in a thickness direction. When the secondary light-receiving pixels 10, 20 and 30 are formed, the photoelectric conversion portions 14, 24 and 34 that photoelectrically convert the lights to be sensed, respectively, and the signal output portions 12, 22 and 32 that output signals from the thin film transistor 40 based on the charges generated by these photoelectric conversion portions 14, 24, and 34 are formed. At this time, the thin film transistor 40 has the gate electrode 44, the gate insulation layer 46, the active layer 48, the source electrode 50 and the drain electrode 52, and the active layer 48 is formed from an oxide semiconductor or an organic semiconductor. In this way, the primary light-receiving pixel 4 constituted by laminating three kinds of the secondary light-receiving pixels 10, 20 and 30 are arrayed in the surface direction of a substrate 2 as shown in FIG. 2 to obtain the image sensor 1.

In the image sensor 1 with such a configuration, the lights incident from the substrate 2 side reach the photoelectric conversion portion 14 of the first secondary light-receiving pixel 10, blue light among the incident lights is selectively absorbed, and positive and negative charges according to the intensity of the blue light, i.e., electron-hole pairs, are generated. A predetermined voltage is being applied between the lower electrode (pixel electrode) 13 and the upper electrode 16, for example, electrons move to the lower electrode 13 side by the electric field generated in the photoelectric conversion portion 14, and the electrons are accumulated in the lower electrode 13. The electrons accumulated in the lower electrode 13 are outputted as signal charges corresponding to the blue light when the TFT 40 provided in the first secondary light-receiving pixel 10 is turned on.

Subsequently the lights which are not absorbed by the photoelectric conversion portion 14 of the first secondary light-receiving pixel 10, i.e., the lights in the wavelength range other than blue light, enter the second secondary light-receiving pixel 20. Further, in the second secondary light-receiving pixel 20, the light in the green light wavelength range is absorbed by the photoelectric conversion portion (light-receiving element) 24. The absorbed green light is photoelectrically converted due to the action similar to the first secondary light-receiving pixel 10 to the blue light, and signal charges corresponding to the green light are outputted when the TFT provided in the second secondary light-receiving pixel 20 is turned on.

Furthermore, the light which is not absorbed by the first and second secondary light-receiving pixels 10 and 20, i.e., the red light, enters the third secondary light-receiving pixel 30, and in the third secondary light-receiving pixel 30, the light in the red light wavelength range is absorbed by the photoelectric conversion portion (light-receiving element)

34. The absorbed red light is photoelectrically converted due to the action similar to the first and second secondary light-receiving pixels 10 and 20 to the blue light and green light, and signal charges corresponding to the red light are outputted when the TFT provided in the second secondary light-receiving pixel 30 is turned on.

In this way, the secondary light-receiving pixels 10, 20 and 30, which respectively sense lights in different wavelength ranges in order to photoelectrically convert the lights, are laminated on the substrate 2 in an insulated state via the sealing insulation layers 18 and 28. Further, signal charges corresponding to the lights of the respective wavelength ranges (BGR) can be respectively outputted, due to the primary light-receiving pixel 4, which is made up of the laminated secondary light-receiving pixels 10, 20 and 30, being arrayed on the substrate 2. An image of a photographic subject can be obtained in full color with a high resolution from a combination of the signals outputted from the secondary light-receiving pixels 10, 20 and 30. Moreover, since the sealing insulation layers 18 and 28, disposed between secondary light-receiving pixels adjacent in the thickness direction, can be very thin compared to the substrate 2 which supports all the light-receiving pixels, blurring of images, which tends to occur readily when a substrate (intermediate substrate) is disposed between the secondary light-receiving pixels, can also be effectively prevented.

Furthermore, the active layer 48 of the thin film transistor 40 which drives each of the secondary light-receiving pixels 10, 20 and 30 is formed from an oxide semiconductor or organic semiconductor, has a high light transmittance as compared with an active layer formed from amorphous silicon, and can pass a larger current at a low voltage. Accordingly, the light quantity to be received by each of the secondary light-receiving pixels 10, 20 and 30 increases, so that an image can be picked up with a high sensitivity and the power consumption can be small. Moreover, when the active layer 48 is formed from an oxide semiconductor or organic semiconductor, in the case of the oxide semiconductor, the active layer 48 is formed, for example, by spattering, and in the case of the organic semiconductor, the active layer 48 is formed, for example, by vacuum deposition, and in the both cases, the active layer 48 can be formed at low temperatures, so that not only a high heat-resistant substrate such as glass, but also a flexible plastic substrate can favorably be used as the support substrate 2. Accordingly, it becomes possible to reduce the size and weight of an image sensor, in which such an image sensor 1 is installed.

Although the use of the image sensor according to the invention is not particularly limited, for example, it can suitably be used as an image sensor (contact image sensor) by bringing the sensor into contact with a photographic subject for picking up an image. Such a contact image sensor is generally equipped with a light source, a lens and a sensor, irradiates sequentially light of each of R, G and B from the light source such as LEDs to a manuscript (photographic subject), and scans the reflected light from the manuscript. In particular, the image sensor according to the invention has a high definition, and can form an image sensor capable of effectively preventing blurring of images, since an intermediate substrate is not interposed between the secondary light-receiving pixels.

Moreover, the image sensor according to the invention is suitable also as an image sensor (image acquiring device) to perform an image pickup at a position apart from a photographic subject, such as digital still cameras, television cameras and the like. The miniaturization and trimming-weight of digital still cameras or television cameras have been progressing, in addition to an increase in high resolution and high sensitivity. The image sensor according to the invention can attain a high resolution and high sensitivity, and can also be produced using a flexible substrate, so that reduction in size and weight of an image acquiring device, to which the image sensor is applied, can also be attained.

The invention is described in the above, but the invention is not limited to the above embodiments. For example, the combination of color lights to be sensed by the secondary light-receiving pixels 10, 20 and 30, respectively, is not limited to R, G and B, for example, can also be yellow (Y), magenta (M) and cyan (C). Moreover, it is not always required to form three kinds of secondary light-receiving pixels respectively, corresponding to the three primary colors (RGB or YMC), for example, and two kinds of secondary light-receiving pixels are laminated to form a primary light-receiving pixel, or four or more kinds of secondary light-receiving pixels may be laminated to form a primary light-receiving pixel.

Further, a light shielding layer may be provided on the surface at the opposite side from the light-receiving side, for example, on the upper electrode 38 in the image sensor 1 as shown in FIG. 2, if necessary.

Moreover, the use of the image sensor according to the invention is not limited to the uses described in the above, but is also suitable for various image sensors for mounting to monitor cameras, TV phones, cellular phones and the like, or image sensors for reading characters and figures written on a white board.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. An image sensor comprising:
   a substrate and primary light-receiving pixels arrayed in a surface direction of the substrate, wherein
   the primary light-receiving pixels are formed by laminating, on one surface of the substrate, a plurality of secondary light-receiving pixels which are respectively sensitive to light in different wavelength ranges, via at least a sealing insulation layer disposed between secondary light-receiving pixels which are adjacent to each other in a thickness direction;
   the plurality of secondary light-receiving pixels each include a photoelectric conversion portion that photoelectrically converts the light, and a signal output portion that outputs signals from a thin film transistor based on charges generated by the photoelectric conversion portion; and
   the thin film transistor includes a gate electrode, a gate insulation layer, an active layer, a source electrode and a drain electrode, and the active layer is formed from an oxide semiconductor or an organic semiconductor.

2. The image sensor according to claim 1, wherein the oxide semiconductor comprises at least one of In, Ga and Zn.

3. The image sensor according to claim 1, wherein the active layer comprises at least a first region and a second region which has a higher electroconductivity than the first region, the second region is in contact with the gate insulation layer, and the first region is electrically connected to the second region and at least one of the source electrode and the drain electrode.

4. The image sensor according to claim 1, wherein the sealing insulation layer is formed of an inorganic compound.

5. The image sensor according to claim 1, wherein the secondary light-receiving pixels which are adjacent to each other in the thickness direction are laminated via the sealing insulation layer and a planarization layer provided on the sealing insulation layer.

6. The image sensor according to claim 1, wherein the primary light-receiving pixels are formed by laminating three secondary light-receiving pixels that receive light corresponding to red, green and blue, respectively.

7. The image sensor according to claim 1, wherein the substrate is a flexible substrate.

8. A contact image sensor including the image sensor according to claim 1.

9. An image acquiring device including the image sensor according to claim 1.

10. A method of manufacturing an image sensor comprising a substrate and primary light-receiving pixels arrayed in a surface direction of the substrate, the primary light-receiving pixels being formed by laminating a plurality of secondary light-receiving pixels respectively sensitive to lights in different wavelength ranges; the method comprising:

laminating the plurality of the secondary light-receiving pixels sequentially on one surface of the substrate via at least a sealing insulation layer disposed between secondary light-receiving pixels which are adjacent to each other in the thickness direction;

forming, when the plurality of secondary light-receiving pixels are formed, a photoelectric conversion portion that photoelectrically converts the light, and a signal output portion that outputs signals from a thin film transistor based on charges generated by the photoelectric conversion portion; and forming the thin film transistor to have a gate electrode, a gate insulation layer, an active layer, a source electrode and a drain electrode, the active layer being formed from an oxide semiconductor or an organic semiconductor.

11. The method of manufacturing an image sensor according to claim 10, wherein the oxide semiconductor comprises least one of In, Ga and Zn.

12. The method of manufacturing an image sensor according to claim 10, wherein the active layer comprises at least a first region and a second region which has a higher electroconductivity than the first region, the second region is in contact with the gate insulation layer, and the first region is electrically connected to the second region and at least one of the source electrode and the drain electrode.

13. The method of manufacturing an image sensor according to claim 10, wherein the sealing insulation layer is formed of an inorganic compound.

14. The method of manufacturing an image sensor according to claim 10, wherein the secondary light-receiving pixels which are adjacent to each other in the thickness direction are laminated via the sealing insulation layer and a planarization layer provided on the sealing insulation layer.

15. The method of manufacturing an image sensor according to claim 10, wherein the primary light-receiving pixels are formed by laminating three secondary light-receiving pixels that receive light corresponding to red, green and blue, respectively.

16. The method of manufacturing an image sensor according to claim 10, wherein the substrate is a flexible substrate.

* * * * *